(12) United States Patent
Djordjevic et al.

(10) Patent No.: US 7,992,070 B2
(45) Date of Patent: Aug. 2, 2011

(54) BIT-INTERLEAVED LDPC-CODED MODULATION FOR HIGH-SPEED OPTICAL TRANSMISSION

(75) Inventors: Ivan B. Djordjevic, Tucson, AZ (US); Milorad Cvjetic, Herndon, VA (US); Lei Xu, Princeton, NJ (US); Ting Wang, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 908 days.

(21) Appl. No.: 11/950,757

(22) Filed: Dec. 5, 2007

(65) Prior Publication Data
US 2008/0163025 A1 Jul. 3, 2008

Related U.S. Application Data

(60) Provisional application No. 60/882,043, filed on Dec. 27, 2006.

(51) Int. Cl.
*H03M 13/00* (2006.01)
(52) U.S. Cl. ........ 714/755; 714/795; 714/801; 714/715; 714/757; 714/799; 714/752; 714/794; 398/182; 398/141; 375/308; 375/265; 375/267; 375/260; 375/316
(58) Field of Classification Search .......................... None
See application file for complete search history.

(56) References Cited

U.S. PATENT DOCUMENTS

| | | | |
|---|---|---|---|
| 6,034,996 A * | 3/2000 | Herzberg | 375/265 |
| 7,062,700 B2 * | 6/2006 | Shen et al. | 714/792 |
| 7,188,301 B1 * | 3/2007 | Cameron et al. | 714/794 |
| 2004/0151507 A1 * | 8/2004 | Agazzi | 398/141 |
| 2006/0212773 A1 * | 9/2006 | Aytur et al. | 714/755 |
| 2007/0266293 A1 * | 11/2007 | Kim | 714/752 |
| 2008/0107202 A1 * | 5/2008 | Lee et al. | 375/267 |
| 2008/0225965 A1 * | 9/2008 | Pi et al. | 375/260 |
| 2011/0044401 A1 * | 2/2011 | Ko et al. | 375/295 |

OTHER PUBLICATIONS

Bahl et al., Optimal Decoding of Linear Codes for Minimizing Symbol Error Rate; IEEE Transactions on Information Theory; Mar. 1974; pp. 284-287.
Caire et al., Bit-Interleaved Coded Modulation; IEEE Transactions on Information Theory; vol. 44. No. 3.; May 1998; pp. 927-946.
Jager et al., Performance of Turbo Equalizers for Optical OMD Channels; Journal of Llightwave Technology, vol. 24, No. 3, Mar. 2006; pp. 1226-1236.

(Continued)

*Primary Examiner* — John Trimmings
(74) *Attorney, Agent, or Firm* — James Bitetto; Joseph Kolodka

(57) ABSTRACT

A transmitter includes a plurality of encoders configured to receive source bit streams from m information sources, each of the plurality encoders including identical (n,k) low-density parity check (LDPC) codes of code rate r=k/n, where k is a number of information bits and n is codeword length. An interleaver is configured to collect m row-wise codewords from the plurality of encoders, and a mapper is configured to receive m bits at a time column-wise from the interleaver and to determine an M-ary signal constellation point. A modulator is configured to modulate a light source in accordance with the output of the mapper at a transmission rate $R_s/r$ ($R_s$—the symbol rate, r—the code rate). A receiver and transmission and receiving methods are also disclosed.

22 Claims, 5 Drawing Sheets

OTHER PUBLICATIONS

Djordjevic et a l., Multilevel Coding in M-ary DPSK/Differential QAM High-Speed Optical Transmission with Direct Detection; Journal of Lightwave Technology; vol. 24, No. 1; Jan. 2006; pp. 420-428.

K. A. Bush; A Generalization of a Theorem due to MacNeish; The Annals of Mathematical Statistics, vol. 23, No. 2; Jun. 1952; pp. 293-295.

Djordjevic et al., Nonlinear BCJR Equalizer for Suppression of Intrachannel Nonlinearities in 40 Gb/s Optical Communications Systems; Optics Express; vol. 14, No. 11; May 2005; 11 pages.

Stephan Ten Brink, Convergence Behavior of Iteratively Decoded Parallel Concatenated Codes; IEEE Transactions on Communications; vol. 49, No. 10; Oct. 2001; pp. 1827-1737.

Stephan Ten Brink, Designing Iterative Decoding Schemes with the Extrinsic Information Transfer Chart; AEU International Journal of Electronics and Communications; vol. 54, No. 6; Nov. 2000; pp. 389-398.

Douillard et al., Iterative Correction of Intersymbol Interference: Turbo-Equalization; ENST de Bretagne; vol. 6, No. 5; Sep.-Oct. 1995; pp. 507-511.

* cited by examiner

BIT-INTERLEAVED LDPC-CODED MODULATION FOR HIGH-SPEED OPTICAL TRANSMISSION

RELATED APPLICATION INFORMATION

This application claims priority to provisional application Ser. No. 60/882,043 filed on Dec. 27, 2006, incorporated herein by reference.

BACKGROUND

1. Technical Field

The present invention relates to coded modulation and more particularly to an iterative bandwidth-efficient coded modulation scheme based on bit-interleaving, low-density parity-check (LDPC) codes, and M-ary differential phase-shift keying.

2. Description of the Related Art

Ethernet was initially introduced as a communication standard for connection of hosts in a local area network (LAN). Due to the low-cost and simplicity compared to other protocols, Ethernet has been rapidly evolved and has already been used to enable campus-size distance connections, and beyond, in metropolitan area networks (MAN). 100 Gb/s transmission is envisioned as a technology for the next generation of Ethernet, because traditionally the Ethernet data rates have grown in 10 fold increments. All electrically time-division multiplexed (ETDM) transceivers operating at 100 Gb/s, although already commercially available, are still very expensive so that alternative approaches to enable a 100 Gb/s transmission using commercially available components operating at lower speeds are intensively sought.

SUMMARY

In particular, direct detection of differential phase-shift keying (DPSK) with a Mach-zehnder delay interferometer (MZDI) has generated significant attention. Return-to-zero (RZ) DPSK can facilitate the implementation of phase-shift keying (PSK) and improve its tolerance to nonlinearities. To improve the spectral efficiency of DPSK, the transmitter and receiver configurations suitable for 4-DPSK, 8-DPSK, and M-DPSK (M>8) may be proposed. These schemes are compatible with hard-decision forward error correction (FEC) schemes. Transmitter and receiver configurations suitable for arbitrary M-ary DPSK and M-ary differential quadrature-amplitude modulation (QAM) (M>2) optical transmission may be provided. An efficient coded modulation scheme, based on multilevel coding (MLC) with low-density parity-check (LDPC) codes as component codes, and parallel independent decoding (MLC/PID) coded modulation scheme provide excellent coding gains and good spectral efficiency. The spectral efficiency (defined in terms bits/symbol) is determined as the sum of code rates of component LDPC codes.

To improve the spectral efficiency of MLC/PID coded modulation schemes, the use of bit-interleaved LDPC-coded modulation is herein provided. In one a particular implementation of bit-interleaved coded modulation (BICM), the source bits coming from m independent sources are encoded using identical LDPC codes, interleaved, and multiplexed using $M=2^m$-ary DPSK according to an appropriate mapping rule. One key difference with other wireless applications includes the use of m identical LDPC encoders for each bit stream operating at bit rate $R_b$ (e.g., 40 Gb/s), instead of only one encoder operating at much higher data rate $mR_b$, which is not feasible in high-speed optical communication systems, for large m.

Possible applications of LDPC-coded BICM include long-haul transmission with bit rates above 100 Gb/s, and 100 G Ethernet. All electrically time-division multiplexed (ETDM) modulators and photodetectors operating at 100 Gb/s are still not widely available, despite recent progress in high-speed electronics, so that alternative approaches to enable a 100 Gb/s transmission using commercially available components are intensively sought.

An alternative technique to 100 Gb/s ETDM is presented herein, which allows >100 Gb/s optical transmission to be achieved using bit-interleaved LDPC-coded modulation, M-ary DPSK (e.g., M=8,16), and commercially available modulators and photodetectors operating at 40 Gb/s. A receiver architecture is composed of two components, a demapper and a LDPC decoder. The demapper is implemented as an a posteriori probability (APP) demapper, and LDPC coder is based on an efficient implementation of a sum-product method/algorithm. To improve the bit-error rate (BER) performance, iterative demapping and decoding is employed. To study the convergence behavior, extrinsic information transfer (EXIT) chart analysis has been applied. To keep the complexity of LDPC decoder reasonably low for high speed implementation, block-circulant LDPC codes are applied. The LDPC-coded BICM scheme in accordance with the present principles is easier to implement than MLC/PID due at least to the fact that the same LDPC code is used for different source streams, and at the same time offers higher spectral efficiency.

A transmitter includes a plurality of encoders configured to receive source bit streams from m information sources, each of the plurality encoders including identical (n,k) low-density parity check (LDPC) codes of code rate $r=k/n$, where k is a number of information bits and n is codeword length. An interleaver is configured to collect m row-wise codewords from the plurality of encoders, and a mapper is configured to receive m bits at a time column-wise from the interleaver and to determine an M-ary signal constellation point. A modulator is configured to modulate a source in accordance with the output of the mapper at a transmission rate greater than the code rate r.

A receiver includes a receiver input configured to resolve portions of an input signal, and a demapper, which is configured to receive the portions of the signal and determine symbol probabilities for the input signal. A plurality of decoders preferably implement a sum-product method. Each decoder includes a same low-density parity check (LDPC) code to enable iterative feedback in a form of extrinsic probabilities from the decoders, which is provided to the demapper such that the symbol probabilities and extrinsic probabilities improve bit-error rate performance.

In another embodiment, a transmitter includes a plurality of encoders configured to receive source bit streams from m information sources, each of the plurality encoders including identical (n,k) low-density parity check (LDPC) codes of code rate $r=k/n$, where k is a number of information bits and n is codeword length. An interleaver is configured to collect m row-wise codewords from the plurality of encoders, and a mapper is configured to receive m bits at a time column-wise from the interleaver and to determine an M-ary signal constellation point. A modulator is configured to modulate a source in accordance with the output of the mapper at a transmission rate of $R_s/r$ where $R_s$ is a symbol transmission rate and r is the code rate wherein at each $l^{th}$ transmission interval a data phasor is transmitted.

Another receiver includes a receiver input configured to resolve portions of an input signal, a demapper configured to receive the portions of the signal and determine symbol probabilities for the input signal and a plurality of decoders implementing a sum-product method. Each decoder is implemented based on a Tanner graph of a low-density parity check (LDPC) code such that all decoders are identical to facilitate iterative feedback in a form of extrinsic probabilities from the decoders, which is provided to the demapper, such that iteration of the extrinsic probabilities improves bit-error rate performance.

A method for transmitting data includes encoding source bit streams from m information sources with a plurality of encoders including identical (n,k) low-density parity check (LDPC) codes of code rate r=k/n, where k is a number of information bits and n is codeword length; interleaving collected m row-wise codewords from the plurality of encoders; mapping m bits at a time column-wise from the interleaving and determining an M-ary signal constellation point; and differentially phase shift keying to modulate a light source in accordance with the output of the mapper at a transmission rate $R_s/r$ where $R_s$ is a symbol data rate, and r is a code rate, and an aggregate rate of $mR_b$ where $R_b$ is a bit rate per information source $R_b$.

A method for receiving data includes receiving an input signal and resolving portions of the input signal; demapping the portions of the signal and determining symbol probabilities for the input signal; decoding symbols with a sum-product method with a plurality of identical decoders, each decoder implemented using a same low-density parity check (LDPC) code; and iteratively feeding back and forwarding extrinsic probabilities between the decoders and a demapper, such that iteration of the extrinsic probabilities is employed to improve bit-error rate performance.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Present embodiments include an iterative bandwidth-efficient coded modulation scheme based on bit-interleaving, low-density parity-check (LDPC) codes, and M-ary differential phase-shift keying. In one embodiment, a bit-interleaved LDPC-coded modulation (BI-LDPC-CM) scheme carries 3 bits/symbol and provides a coding gain of at least 8.3 dB at bit-error rate (BER) of $10^{-7}$. The expected coding gain at BER of $10^{-12}$ is at least 12.8 dB. Possible applications include 100G Ethernet, and high-speed (e.g., >100 Gb/s) long-haul transmission.

An alternative embodiment achieves $\geq$100 Gb/s optical transmission using bit-interleaved low-density parity-check (LDPC)-coded modulation (BI-LDPC-CM), M-ary DPSK (M=8,16), and commercially available modulators and photodetectors operating at 40 Gb/s.

Embodiments described herein may be entirely hardware, entirely software or including both hardware and software elements. In a preferred embodiment, the present invention may be implemented in software, which may include but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

Figure 1:
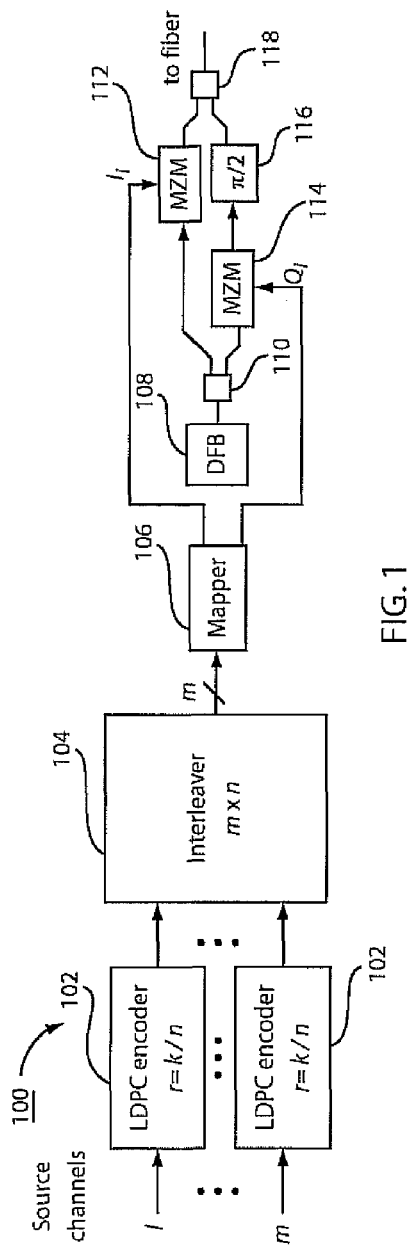
FIG. 1 is a block diagram showing a transmitter architecture for bit-interleaved low-density parity check (LDPC) coded modulation (BI-LDPC-CM) scheme in accordance with the present principles.

High-Speed optical transmission based on bit-interleaved LDPC-coded modulation (BI-LDPC-CM) and M-ary DPSK will now be illustratively described in accordance with the present principles. Referring now to the drawings in which like numerals represent the same or similar elements and initially to FIG. 1, a bit-interleaved LDPC-coded modulation transmitter architecture 100 is illustratively shown in accordance with one embodiment. Source bit streams 1-$m$ coming from m information sources (e.g., carrying 40 Gb/s traffic) are encoded using identical (n,k) LDPC codes of code rate r=k/n (k—the number of information bits, n—the codeword length) of LDPC encoders 102. An interleaver 104, implemented as, e.g., an m×n block-interleaver, collects m codewords written row-wise. A mapper 106 accepts m bits from the interleaver 104 at a time, column-wise. Mapper 106 determines a corresponding M-ary (M=$2^m$) signal constellation point, using differential encoding: at each $l^{th}$ transmission interval a data phasor $\phi_l = \phi_{l-1} + \Delta\phi_l$ is sent, where $\Delta\phi_l \in \{0, 2\pi/M, \ldots, 2\pi(M-1)/M\}$. Different mappers 106 may be employed, e.g., Gray, anti-Gray, natural, and dopped (combined) mappers. The transmitted signal, in ith transmission interval, may be written in complex notation as:

$$s(t) = \Sigma_i I_i g(t-lT) + j Q_i g(t-lT), \quad (1)$$

where $I_i$ and $Q_i$ are equal to (assuming M-ary DPSK signaling) $\cos(\phi_{i-1}+\Delta\phi_i)$ and $\sin(\phi_{i-1}+\Delta\phi_i)$, respectively. g(t) denotes a transmitted signal pulse shape.

$I_i$ and $Q_i$ are employed in modulators 112 and 114 respectively. Modulators 112 and 114 may be of the Mach-Zehnder (MZ) type or equivalent intensity modulator. A distributed feedback (DFB) laser 108 is provided as an optical source and the output of laser 108 can be split or multiplexed (110) for the modulators 112 and 114. A phase shifter 116 may be employed to provide π/2—phase shift for $Q_i$ signal, and a coupler 118 may direct modulated light down an optical fiber for transmission.

Note that the conventional MLC scheme employs different $(n,k_i)$ LDPC codes ($k_i$—dimensionality of $i^{th}$ component LDPC code), and it is able to carry $\Sigma k_i/n$ bits per symbol. This is generally smaller than m, the number of bits/symbol of bit-interleaved method in accordance with the present principles. Moreover, the use of the same LDPC code permits iterating between an a posteriori probability (APP) demapper 214 and LDPC decoders 220 in a receiver 200 (FIG. 2), improving the BER performance.

The source bits in channels 1-m may originate from a single source as well, and in that case only one LDPC encoder/decoder is needed. It is also possible to multiplex the bits from m source channels into one data stream, and use only one LDPC code, in a fashion similar to wireless communications. However, the LDPC encoder/decoder operating speed would be $mR_b$ ($R_b$-the bit rate), which is too high for currently available high-speed electronics. Such a solution also needs an additional interleaver and de-interleaver.

Iterating between LDPC decoders 220 and demapper 214 (FIG. 2) is also possible in MLC schemes. However, the multistage decoding, in which decisions from lower decoding stages are passed to higher stages, must be employed, which introduces inherently large decoding delay to be of practical importance for very high-speed applications, such as optical communications. Other modulation schemes, such as an M-ary differential quadrature-amplitude modulation (DQAM), are also applicable. In DQAM, different signal constellation points are to be transmitted with different amplitudes, and as such are more sensitive to self-phase modulation and intrachannel four-wave mixing, for symbol rates at 40 Giga symbols/s and above. Moreover, to exploit fully the advantages of DQAM, a modified block differential encoding, which accounts for the noncoherent metric, can be considered. However, this approach would increase the transmitter/receiver complexity and reduce the overall code rate.

Figure 2:
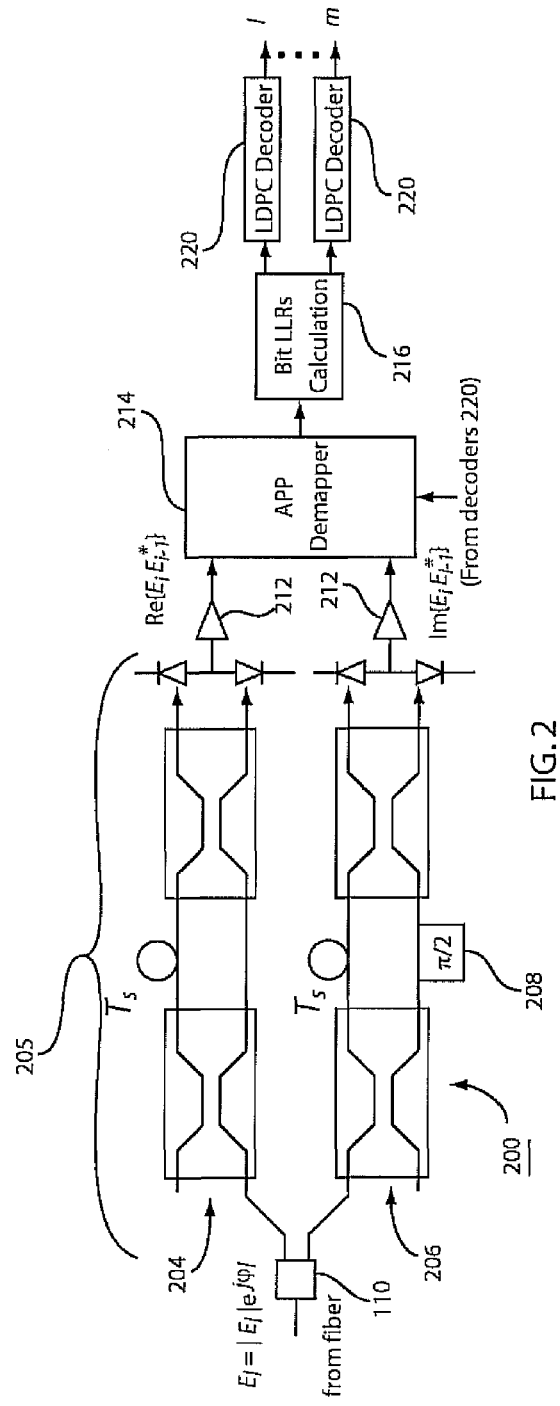
FIG. 2 is a block diagram showing a receiver architecture for bit-interleaved LDPC-coded modulation scheme in accordance with the present principles.

Referring to FIG. 2, a bit-interleaved LDPC-coded modulation receiver architecture 200 is illustratively shown. For the receiver input $E_l=|E_l|\exp(j\phi_l)$ at lth transmission interval, outputs of an upper-balanced receiver 204 and a lower-balanced receiver 206 are proportional to real and imaginary parts: $\text{Re}\{E_lE^*_{l-1}\}$ and $\text{Im}\{E_lE^*_{l-1}\}$, respectively. Symbol period is $T_s=1/R_s$, where $R_s$ is the symbol rate.

Let $r=(r_I, r_Q)$ represent the received signal constellation point, with $r_I$ and $r_Q$ are samples of upper- and lower-balanced receivers 204 and 206, respectively, at an $l^{th}$ symbol interval; let $c=(c_0, c_1, \ldots, c_{m-1})$ represent the binary sequence at the output of an interleaver 104, which is mapped into $s=(I_l, Q_l)$ signal constellation point. An APP demapper 214 determines symbol log-likelihood ratios (LLRs) as:

$$\lambda(s) = \log\frac{P(s = s_0 \mid r)}{P(s \neq s_0 \mid r)}, \quad (2)$$

where P(s|r) is determined using Bayes' rule:

$$P(s \mid r) = \frac{P(r \mid s)P(s)}{\sum_{s'} P(r \mid s')P(s')}. \quad (3)$$

In Eq. (3), P(r|s) is estimated by a determination of histograms, by propagating a sufficiently long training sequence. P(s) denotes the a priori probability of symbol s, whose LLR $\lambda_a(s)$ is determined from LDPC decoders extrinsic LLRs, $L_{D,e}(c)$, by:

$$\lambda_a(s) = \log P(s) = \sum_{j=0}^{m-1}(1-c_j)L_{D,e}(c_j). \quad (4)$$

$s_0$ is a referent symbol. Bit LLRs are determined in block 216 from symbol LLRs by:

$$L(\hat{c}_j) = \log\frac{\sum_{s:\, c_j=0} \exp[\lambda(s)]}{\sum_{s:\, c_j=1} \exp[\lambda(s)]}, \quad (5)$$

and the APP demapper extrinsic LLRs for LDPC decoders by:

$$L_{M,e}(\hat{c}_j) = L(\hat{c}_j) - L_{D,e}(c_j). \quad (6)$$

The LDPC decoder(s) 220 is/are implemented by employing an efficient implementation of a sum-product method. The LDPC decoders extrinsic LLRs, $L_{D,e}$, are fed to the APP demapper 214 as a priori symbol LLRs, $L_{M,a}$, by using Eq. (4), and substituting Eq. (4) into Eq. (3). The iteration between the APP demapper 214 and LDPC decoder 220 is performed until the maximum number of iterations is reached or a valid code-word(s) is/are obtained.

To study the convergence properties of the present BI-LDPC-CM scheme, an extrinsic information transfer (EXIT) chart analysis may be employed. To determine the mutual information (MI) characteristics of the demapper 214, we model a priori input LLR, $L_{M,a}$, as a conditional Gaussian random variable. The MI between c and $L_{M,a}$ is determined numerically. See e.g., S. ten Brink, "Designing iterative decoding schemes with the extrinsic information transfer chart," *AEÜ Int. J. Electron. Comm.*, vol. 54, pp. 389-398, December 2000, incorporated herein by reference, hereinafter ten Brink.

Similarly, the MI $I_{L\,M,e}$ between c and $L_{M,e}$ is calculated numerically, but with the probability density function (p.d.f.) of c and $L_{M,e}$ determined from histogram obtained by Monte Carlo simulation, as explained in ten Brink, referenced above. By observing that $I_{L\,M,e}$ is a function of the MI $I_{L\,M,a}$ and optical signal-to-noise ratio, OSNR, in dB, the demapper EXIT characteristic (denoted by $T_M$) is given by $I_{L\,M,e}=T_M(I_{L\,M,1}, \text{OSNR})$. The EXIT characteristic of LDPC decoder (denoted by $T_D$) is defined in a similar fashion as $I_{L\,D,e}=T_D(I_{LD,a})$, where $I_{L\,D,e}$ is MI between c and the decoder extrinsic LLRs, while $I_{L\,D,a}$ is MI between c and decoder a priori LLRs (demapper extrinsic LLRs). The "turbo" demapping based receiver operates by passing extrinsic LLRs between demapper 214 and LDPC decoder 220. The iterative process starts with an initial demapping in which $L_{M,a}$ is set to zero, and as a consequence $T_{L\,M,a}=0$. The demapper 214 outputs LLRs, described by $L_{LM,e}=I_{LD,a}$, which are fed to LDPC decoders 220 (e.g., using Tanner graphs). The LDPC decoder output LLRs, described by $I_{L\,D,e}=I_{L\,M,a}$ are fed to the APP demapper 214. The iterative procedure is repeated until convergence or until the maximum number of iterations has been reached. This procedure is illustrated in FIGS. 3A and 3B, where the APP demapper 214 and LDPC decoder 220 EXIT charts are combined together.

Figures 3A, 3B:
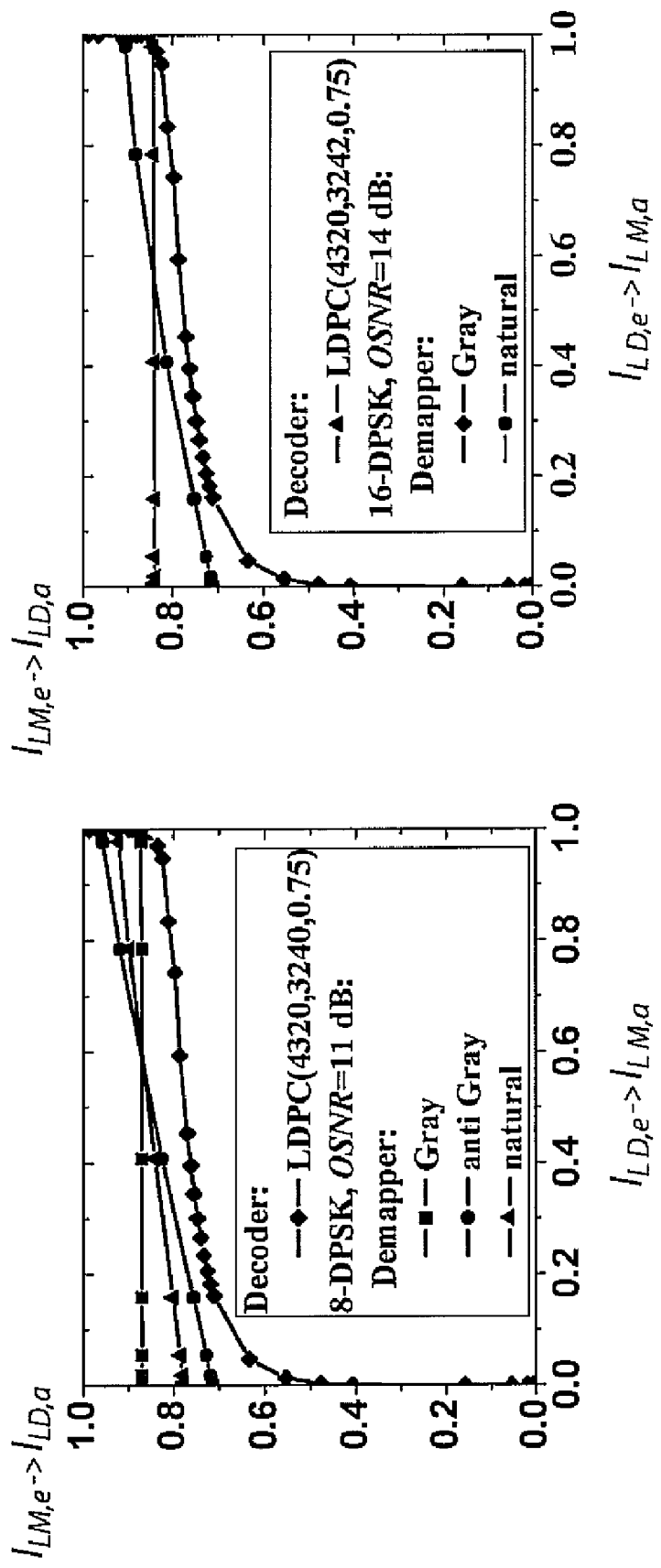
FIGS. 3A and 3B show EXIT charts for different mappings, and LDPC(4320,3240) code for 8-DPSK at OSNR=11.04 dB (FIG. 3A), and 16-DPSK at OSNR=14.04 dB (FIG. 3B)

Referring to FIG. 3A and 3B, 8-DSPK (FIG. 3A), 16-DPSK (FIG. 3B), and three different mappings: natural, Gray, and anti-Gray are illustratively depicted. Different mappings produce the EXIT curves with different slopes. The existence of a "tunnel" between the demapping and decoder curves suggests that iteration between the demapper and decoder will result in successful decoding. The smallest OSNR at which iterative scheme converges defines the threshold or pinch-off limit, which is in the case of 16-DPSK about 3 dB worse compared to 8-DPSK. To facilitate implementation at high-speed, we employ highly structured LDPC codes instead of irregular ones proposed for wireless applications.

Figure 4B:
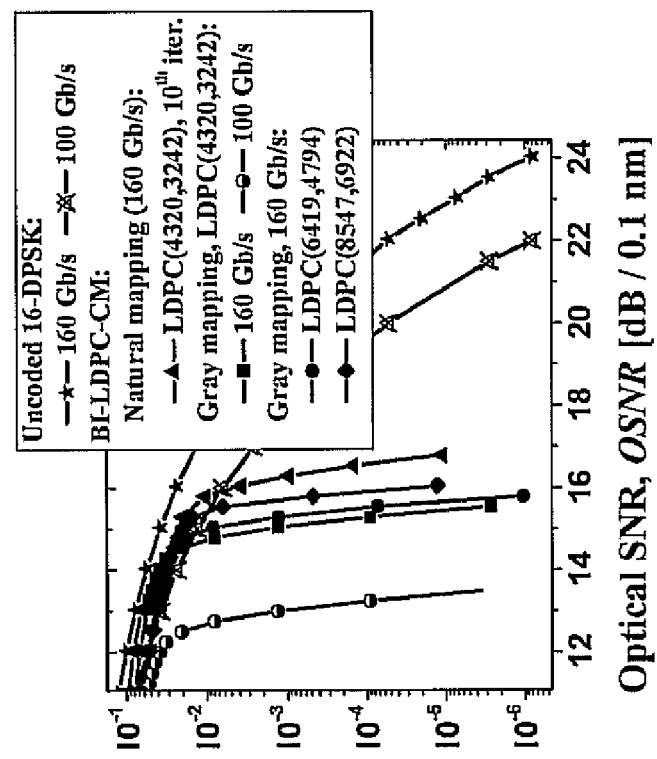
FIG. 4A and 4B show BER performance of a BI-LDPC-CM scheme on an AWGN channel model for 8-DPSK (FIG. 4A), and 16-DSPK (FIG. 4B)
Figure 4A:
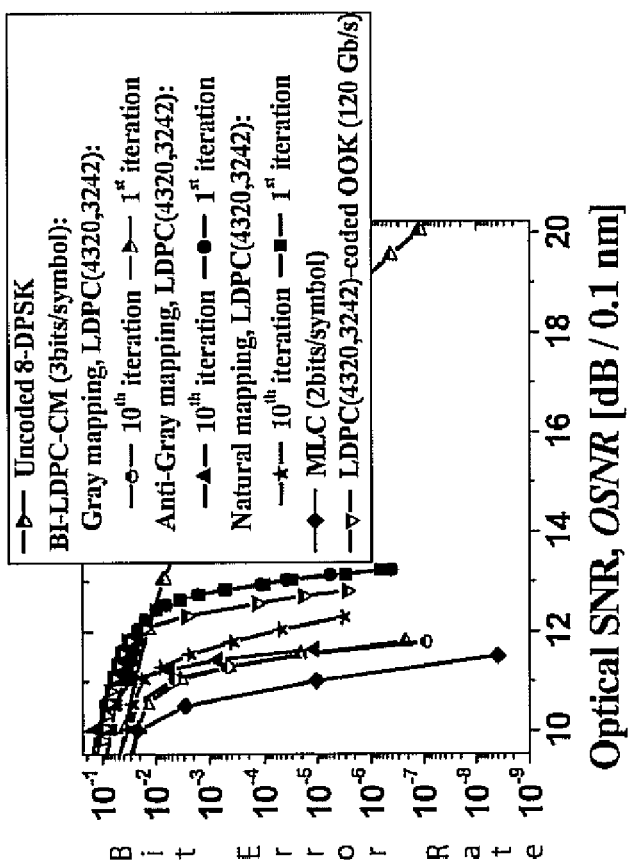

Referring to FIGS. 4A and 4B, simulation results for an additive Gaussian noise (AWGN) channel model are illustratively shown for 30 iterations in a sum-product method/algorithm. The information symbol rate is set to 40 Giga symbols/s, 8-DPSK (FIG. 4A) and 16-DPSK (FIG. 4B) are employed in simulations, and maximum aggregate bit rate is 120 Gb/s and 160 Gb/s, respectively.

The improvement (over the first iteration) after the $10^{th}$ outer iteration for the Gray mapping rule is insignificant, which was expected from the EXIT chart shown in FIGS. 3A and 3B. The EXIT chart for the Gray-demapper is a horizontal line suggesting that iteration between the demapper and the LDPC decoder helps very little in BER performance improvement.

On the other hand, the iteration between demapper and decoder in the case of the anti-Gray mapping provides more than 1 dB improvement at BER=$10^{-7}$. However, for 8-DPSK signaling, the anti-Gray turbo demapper performs comparable to the Gray demapper-decoder after the first iteration. The Gray mapping based turbo demapper (for 8-DPSK) provides the coding gain of 8.3 dB at BER of $10^{-7}$. The expected coding gain at BER of $10^{-12}$, obtained by extrapolation, is about 12.8 dB. Note that girth-6 LDPC codes of code rate above 0.8 (e.g., girth-6 LDPC codes), lag far behind the employed girth-8 LDPC codes. The symbol rate of the present scheme is 49.4 Giga symbols/s for 0.81 rate LDPC (8547,6922) code and 53.4 Giga symbols/s for 0.75 rate LDPC(4320,3242) code.

Notice also that the Gray-mapped BI-LDPC-CM scheme (carrying 3 bits/symbol and operating at 53.4 Gsymbols/s) performs comparably to the more complicated MLC scheme (carrying 2 bits/symbol and operating at 50 Gsymbols/s) at low BERs, and provides higher spectral efficiency. An equivalent on-off keying (OOK) scheme operating at 120 Gb/s performs more than 1 dB worse than BI-LDPC-CM based on Gray mapped 8-DPSK with aggregate bit rate of 120 Gb/s. Moreover, the influence of intrachannel nonlinearities and polarization mode dispersion (PMD) is much less severe at 40 Giga symbols/s than at 120 Gb/s.

Figure 5:
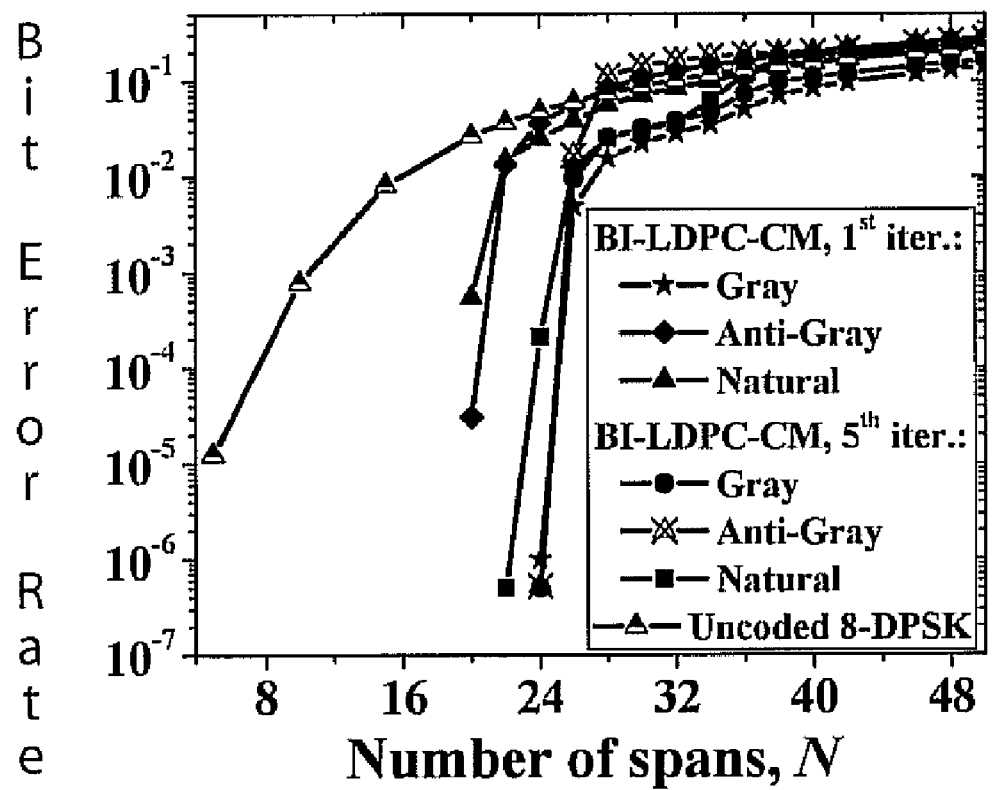
FIG. 5 shows a dispersion map for BERs of BI-LDPC-CM for 8-DPSK.

Referring to FIG. 5, results of Monte Carlo simulations for a dispersion map described below are shown. The dispersion map is composed of N spans of length L=120 km, each span consisting of 2L/3 km of $D_+$ optical fiber followed by L/3 km of $D_-$ optical fiber. (The fiber parameters are given in I. B. Djordjevic, and B. Vasic, "Multilevel coding in M-ary DPSK/differential QAM high-speed optical transmission with direct detection," J. Lightw. Technol., vol. 24, pp. 420-428, January 2006). The pre-compensation of −1600 ps/nm and corresponding post-compensation are also employed. The simulations were carried out with the launched power per symbol of 0 dBm, and a central wavelength of 1552.524 nm. 8-DPSK with RZ pulses of duty cycle 33% was considered. The propagation of a signal through the transmission media was modeled by a nonlinear Schrödinger equation solved using the split-step Fourier method. The effects of self-phase modulation, nonlinear phase-noise, intrachannel cross-phase modulation, intrachannel four-wave mixing, stimulated Raman scattering, chromatic dispersion, ASE noise and intersymbol interference are taken into account.

The iterative bandwidth-efficient bit-interleaved LDPC-coded modulation scheme in accordance with the present principles employs M-ary DPSK signaling, and the receiver is based on an APP demapper and LDPC decoder. The present scheme, with 3 bits/symbol, provides a coding gain of 8.3 dB at bit-error rate of $10^{-7}$, and expected coding gain at BER of $10^{-12}$ is about 12.8 dB. With a Gray mapping based BI-LDPC-CM scheme, a transmission distance larger than 2760 km is possible. The present embodiments are also suitable for 100 Gb/s Ethernet. By using 16-DPSK and BI-LDPC-CM, it is possible to achieve 160 Gb/s transmission using commercially available electronics operating at 40 Gb/s. Once the ETDM technology at 100 Gb/s becomes mature enough, the scheme proposed herein can be used to achieve ≧400 Gb/s transmission.

Figure 6:
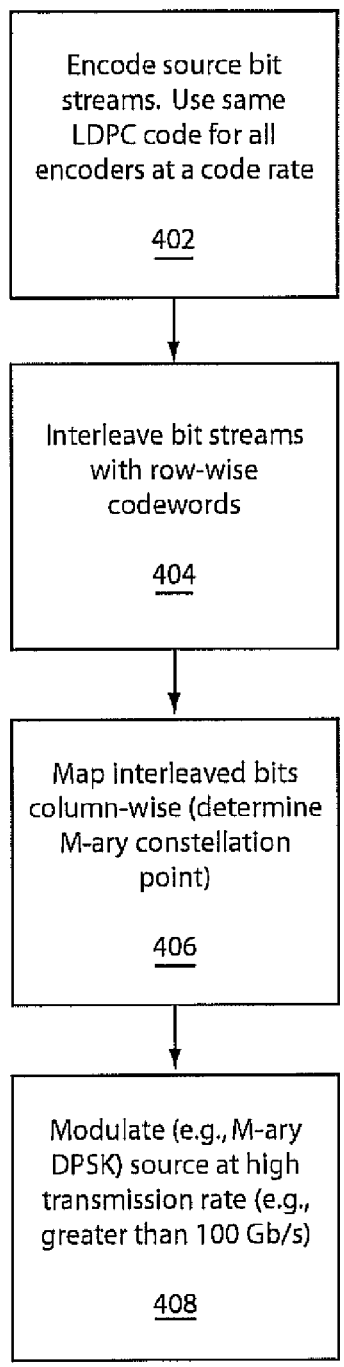
FIG. 6 is a flow diagram showing an illustrative transmission method in accordance with the present principles.

Referring to FIG. 6, a method for transmitting data in accordance with the present principles is illustratively shown. In block 402, source bit streams are encoded from m information sources with a plurality of encoders including identical (n,k) low-density parity check (LDPC) codes of code rate r=k/n, where k is a number of information bits and n is codeword length. In block 404, interleaving of m row-wise codewords from the plurality of encoders is performed. In block 406, m bits at a time are mapped column-wise from the interleaving and an M-ary signal constellation point is determined for modulation.

In block 408, differentially phase shift key modulating a source (e.g., a laser) in accordance with the output of the mapper at a transmission rate $R_s/r$ is performed. (e.g., using M-ary (M=$2^m$) differential phase shift keying (DPSK). ($R_s$ denotes the symbol rate, e.g. 40 Giga symbols/s, and r denotes the LDPC code rate.) The aggregate transmission rate ($mR_b$) is at least 100 Gb/s (although greater and even lesser rate can be achieved in accordance with the present principles. The encoder operating rate may be e.g., 40 Gb/s.

Figure 7:
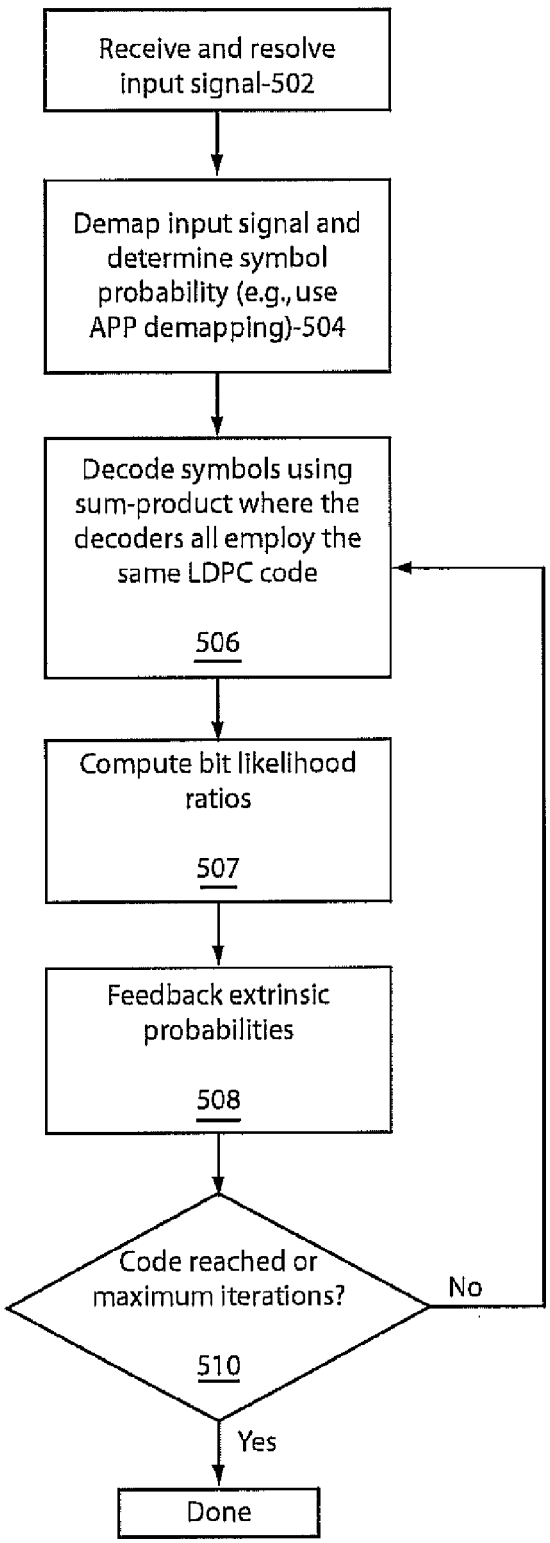
FIG. 7 is a flow diagram showing an illustrative receiver method in accordance with the present principles.

Referring to FIG. 7, a method for receiving data in accordance with the present principles is illustratively shown. In block 502, an input signal is received and resolved into portions (e.g., real and imaginary portions). In block 504, the portions of the signal are demapped and symbol probabilities are determined for the input signal. Demapping includes a posteriori probability (APP) demapping. The symbol probabilities preferably include log-likelihood ratios (LLRs).

in block 506, symbols are decoded with a sum-product method using a plurality of decoders, each decoder including a same low-density parity check (LDPC) code.

In block 507, bit log-likelihood ratios (LLRs) are computed. In block 508, iterative feedback in the form of extrinsic probabilities from the decoders is provided to the demapper. The extrinsic probabilities are provided to the demapper such that the symbol probabilities and the extrinsic probabilities are employed to improve bit-error rate performance. Iterating continues until a valid codeword is determined or a number of iterations has been performed in block 510, Having described preferred embodiments of a systems and methods (which are intended to be illustrative and not limiting) it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A transmitter, comprising:
   a plurality of encoders configured to receive source bit streams from m information sources, each of the plurality encoders including identical (n,k) low-density parity check (LDPC) codes of code rate r=k/n, where k is a number of information bits and n is codeword length;
   an interleaver configured to collect m row-wise codewords from the plurality of encoders;
   a mapper configured to receive m bits at a time column-wise from the interleaver and to determine an M-ary signal constellation point; and
   a modulator configured to modulate a source in accordance with the output of the mapper at a transmission rate of $R_s/r$ where $R_s$ is a symbol transmission rate and r is the code rate wherein at each $l^{th}$ transmission interval a data phasor is transmitted.

2. The transmitter as recited in claim 1, wherein an aggregate transmission rate is at least 100 Gb/s.

3. The transmitter as recited in claim 1, wherein the plurality of LDPC encoders includes m encoders configured in parallel.

4. The transmitter as recited in claim 1, wherein the plurality of LDPC encoders includes less than m encoders and the plurality of encoders are multiplexed to the interleaver.

5. The transmitter as recited in claim 1, wherein the mapper is configured to provide M-ary differential phase shift keying (DPSK).

6. The transmitter as recited in claim 5, wherein $M=2^m$.

7. The transmitter as recited in claim 1, wherein the mapper includes one of a Gray mapper, an anti-Gray mapper and a natural mapper.

8. The transmitter as recited in claim 1, wherein m is greater than $\Sigma k_i/n$ where $k_i$ is a dimensionality of an $i^{th}$ component LDPC code in a multilevel coding case.

9. A receiver, comprising:
   a receiver input configured to resolve portions of an input signal;
   a demapper configured to receive the portions of the signal and determine symbol probabilities for the input signal; and
   a plurality of decoders implementing a sum-product method, each decoder being implemented based on a low-density parity check (LDPC) code such that all decoders are identical to facilitate iterative feedback in a form of extrinsic probabilities from the decoders, which is provided to the demapper, such that iteration of the extrinsic probabilities improves bit-error rate performance.

10. The receiver as recited in claim 9, wherein the extrinsic probabilities include a priori symbol probabilities which are updated by using extrinsic log-likelihood ratios (LLRs) of the LDPC decoders.

11. The receiver as recited in claim 9, further comprising a bit LLR calculation module coupled to the demapper and configured to compute bit log-likelihood ratios (LLRs) for soft iterative decoding.

12. The receiver as recited in claim 9, wherein the demapper includes an a posteriori probability (APP) demapper.

13. The receiver as recited in claim 9, wherein the iterative feedback continues until a valid codeword is determined or a predetermined number of iterations has been reached.

14. A method for transmitting data, comprising:
   encoding source bit streams from m information sources with a plurality encoders including identical (n,k) low-density parity check (LDPC) codes of code rate r=k/n, where k is a number of information bits and n is codeword length;
   interleaving collected m row-wise codewords from the plurality of encoders;
   mapping m bits at a time column-wise from the interleavering and determining an M-ary signal constellation point; and
   differentially phase shift keying to modulate a light source in accordance with the output of the mapper at a transmission rate $R_s/r$ where $R_s$ is a symbol data rate, and r is a code rate, and an aggregate rate of $mR_b$ where $R_b$ is a bit rate per information source $R_b$.

15. The method as recited in claim 14, wherein the transmission rate is at least 100 Gb/s.

16. The method as recited in claim 14, wherein mapping selects a differential phase based on m bits from an interleaver, providing M-ary ($M=2^m$) differential phase shift keying (DPSK).

17. A method for receiving data, comprising:
   receiving an input signal and resolving portions of the input signal;
   demapping the portions of the signal and determining symbol probabilities for the input signal;
   decoding symbols with a sum-product method with a plurality of identical decoders, each decoder implemented using a same low-density parity check (LDPC) code; and
   iteratively feeding back and forwarding extrinsic probabilities between the decoders and a demapper, such that iteration of the extrinsic probabilities is employed to improve bit-error rate performance.

18. The method as recited in claim 17, wherein bit log-likelihood ratios (LLRs) are calculated from symbol probabilities.

19. The method as recited in claim 18, wherein the bit LLRs are processed by a soft iterative LDPC decoder based on a sum-product method.

20. The method as recited in claim 17, wherein demapping is performed based on a posteriori probability (APP) demapping.

21. The method as recited in claim 20, wherein the APP demapper processes channel samples, histogram estimated symbol probability density functions, and LDPC decoder extrinsic LLRs to determine a posteriori symbol probabilities for a next iteration.

22. The method as recited in claim 17, wherein the extrinsic probabilities are iterated back and forward between LDPC decoders and the demapper, until a valid codeword is obtained or a predetermined number of iterations has been reached.

* * * * *